United States Patent
Havens et al.

(10) Patent No.: US 6,181,137 B1
(45) Date of Patent: Jan. 30, 2001

(54) UNIFIED SHIMMING FOR MAGNETIC RESONANCE SUPERCONDUCTING MAGNETS

(75) Inventors: Timothy John Havens; Xianrui Huang; Robert Sethfield Smith; Steven Ho-Chong Wong, all of Florence, SC (US); Michele Ogle, Burnt Hills, NY (US); Bu-Xin Xu; Minfeng Xu, both of Florence, SC (US)

(73) Assignee: General Electric Company, Milwaukee, WI (US)

(*) Notice: Under 35 U.S.C. 154(b), the term of this patent shall be extended for 0 days.

(21) Appl. No.: 09/360,712

(22) Filed: Jul. 26, 1999

(51) Int. Cl.[7] ........................................ G01V 3/00
(52) U.S. Cl. ............................ 324/320; 324/319
(58) Field of Search ..................... 324/320, 319; 364/578; 335/301

(56) References Cited

U.S. PATENT DOCUMENTS

| 5,003,266 | * | 3/1991 | Palkovich et al. ........... 324/320 |
| 5,045,794 | * | 9/1991 | Dorri et al. ................. 324/320 |
| 5,389,909 | * | 2/1995 | Havens ........................ 335/216 |
| 5,623,430 | * | 4/1997 | Dorri .......................... 364/578 |
| 5,999,076 | * | 12/1999 | Becker, Jr. et al. .......... 335/301 |

* cited by examiner

*Primary Examiner*—Jay Patidar
*Assistant Examiner*—Brij B. Shrivastav
(74) *Attorney, Agent, or Firm*—Irving M. Freedman; Christian G. Cabou; Phyllis Y. Price

(57) ABSTRACT

A method for shimming a magnetic resonance imaging magnet requiring higher magnetic field homogneity on a small imaging volume and by magnetic field measurements on a larger volume providing small measurement error and practical field strength measurements and utilizing the spherical harmonic coefficients of the measurements.

19 Claims, 2 Drawing Sheets

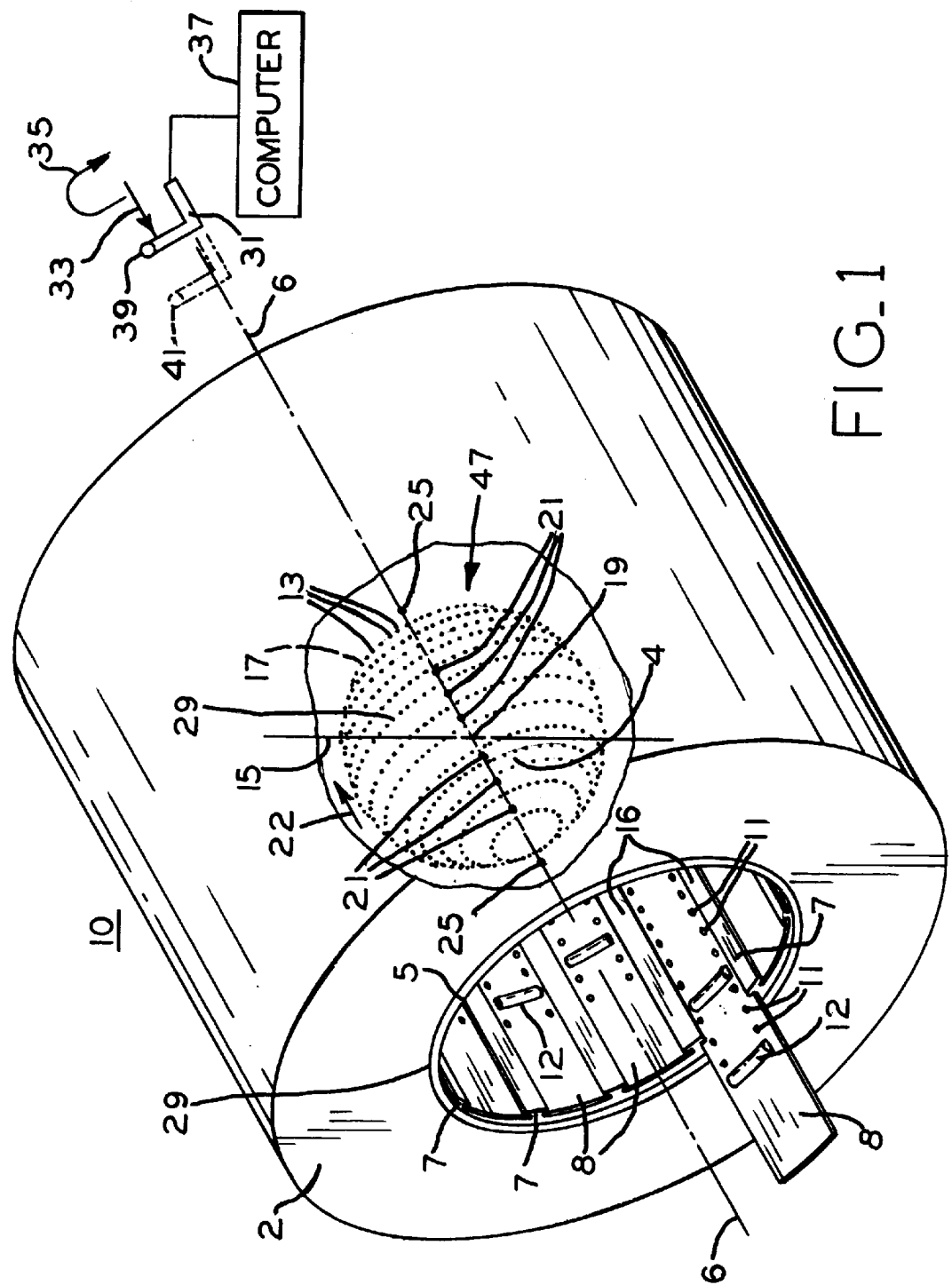
FIG_1

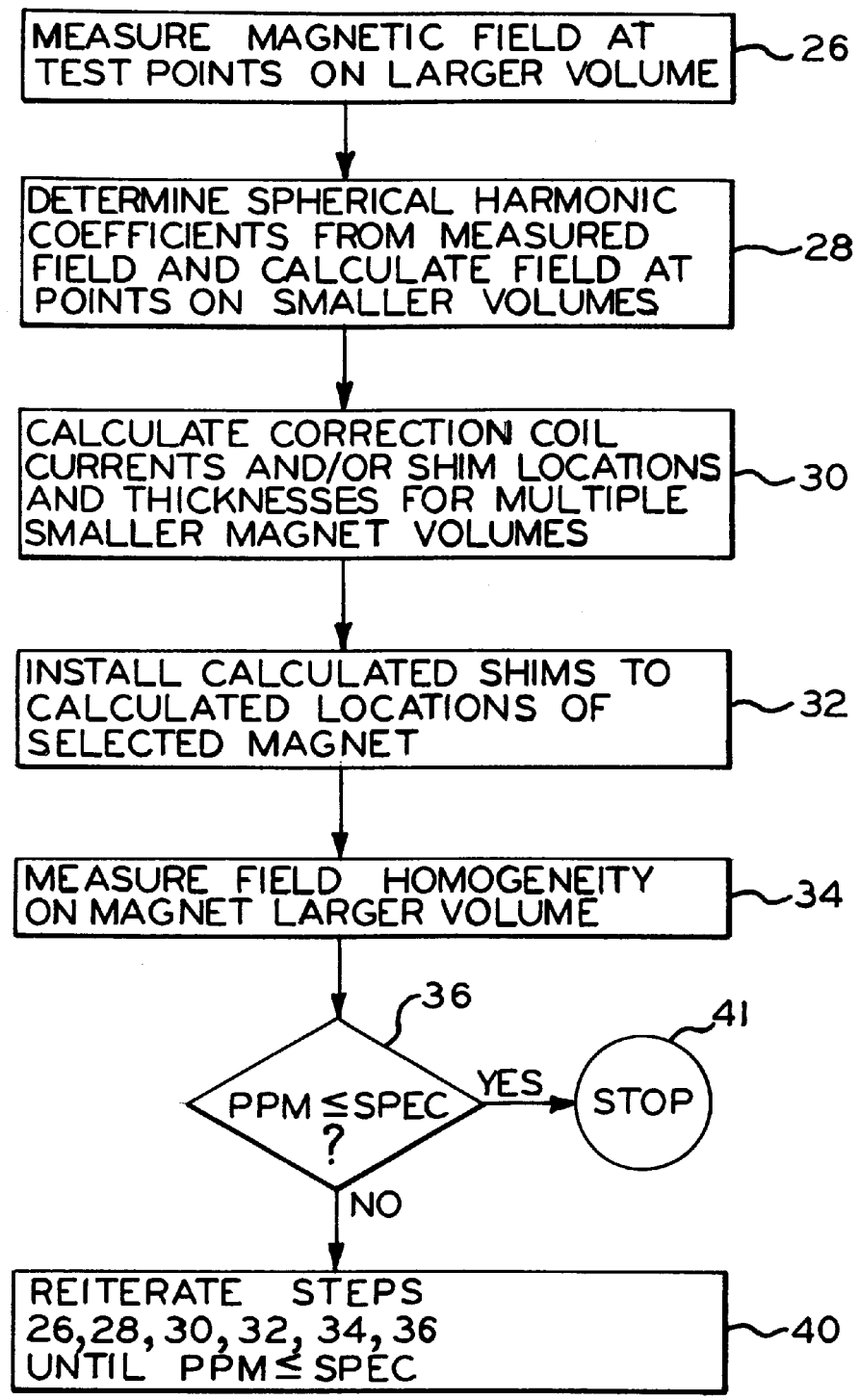
FIG_2

UNIFIED SHIMMING FOR MAGNETIC RESONANCE SUPERCONDUCTING MAGNETS

BACKGROUND OF INVENTION

This invention relates to a magnet assembly for a magnetic resonance imaging system (hereinafter called "MRI"), and more particularly to an improved and simplified arrangement for improving magnetic field homogeneity in a plurality of related magnets, including those with small imaging volumes and stringent homogeneity requirements which can not be accurately mapped because of measurement equipment limitations.

As is well known, a magnet can be made superconducting by placing it in an extremely cold environment, such as by enclosing it in a cryostat or pressure vessel containing liquid helium or other cryogen. The extreme cold ensures that the magnet coils are made superconducting, such that when a power source is initially connected to the coils for a short period to introduce a current flow through the coils, the current continues to flow even after power is removed due to the absence of resistance, thereby maintaining a strong magnetic field. Superconducting magnets find wide application in the field of MRI.

However, MRI requires very strong or large magnetic fields in a small imaging bore or volume with a very high degree of uniformity or homogeneity. Typically this requirement which has been on the order of 10 parts per million (ppm) inhomogeneity on a 45 to 50 cm diameter spherical volume (DSV) cannot be achieved by controlling manufacturing tolerances. After manufacturing the magnet with the best achievable tolerances, the inohomogeneity is typically one or two orders of magnitude above the desired level, and a magnetic field shimming system is used to reduce the inhomogeneity level from several hundred ppm to the desired 10 ppm over the 45 to 50 cm spherical volume.

While the problem of shimming a magnet to 10 ppm on a 45 cm volume has been achieved, more demanding applications require smaller levels of inhomogeneity on smaller volumes. These demanding applications include cardiac imaging and high speed MRI scanning using Diffusion Weighted Echo Planar Imaging (DWEPI). Such scan systems are most sensitive to inhomogeneity. However, present test equipment does not enable practical magnetic field mapping at such low inhomogeneity levels. These applications require reduced inhomogeneity levels such as in the order of 0.5 ppm on 25 cm DSV, and 1 ppm on 35 cm DSV to enable the effective use of MRI.

In practice, shim systems utilize extra coils, typically called correction or shimming coils, small pieces of iron, typically called passive shims, or some combination of the two to correct or improve the magnetic field homogeneity while allowing reasonable manufacturing tolerances. Current flow provided through the shimming coils produce magnetic fields to cancel and/or minimize the magnetic field inhomogeneities in the imaging volume.

Considerable engineering and development effort has been applied for some time to improving and simplifying, to the extent possible, the magnetic field homogeneity systems for MRI devices in order to improve imaging quality with uncomplex means and without additional expense. In addition, it is desirable to utilize existing shimming hardware.

Thus, there is a particular need for an MRI shimming system which provides improved magnetic field imaging homogeneity for small volumes and yet which is uncomplex, minimizes the shims used, and utilizes to the extent possible existing test equipment and shimming hardware.

BRIEF SUMMARY OF INVENTION

In an embodiment of the invention, the magnetic field of a magnetic resonance imaging magnet is mapped at a plurality of points on separated planes vertical to the axis of the magnet about a larger volume than the desired imaging volume. The mapping is used to calculate the correction coil currents and/or passive shim locations and thickness as needed to provide the required magnetic field homogeneity in both large and small volumes. The mapping is done on a relatively large volume where measurement error is small relative to the true variation in measured values, which are then used through their spherical harmonic coefficients to reconstruct and provide a shimming solution for improved homogeneity for smaller imaging volumes which can not be accurately mapped because of measurement equipment limitations. The method thus provides the shimming for the imaging volume mapped plus the shimming for additional smaller imaging volumes having more critical homogeneity requirements.

BRIEF DESCRIPTION OF DRAWINGS

FIG. 1 is a partially cutaway perspective view of an MRI magnet with an internal imaginary enlarged spherical grid to illustrate the location of field measurements in accordance with the embodiment of the invention shown.

FIG. 2 is a flow chart showing the steps in shimming the superconducting magnet of FIG. 1.

DETAILED DESCRIPTION OF THE PREFERRED EMBODIMENT

Referring to FIG. 1, superconducting magnet 10 includes a plurality of superconducting coils (not shown) in a helium pressure vessel (not shown) within vacuum vessel 2 to provide a magnetic field in the central axial imaging volume 4 of the magnet along axis 6 in the manner well known in the art. Equally spaced along the interior surface of vacuum vessel 2 along bore 5 are a plurality of axially extending arcuate shaped drawers 8 sliding within slides or rails 17 and carrying a plurality of magnetic shims 12 secured across axially extending rows of apertures 11. Twelve drawers 8 are equally spaced around Z axis 6 with each including 25 or more sets of holes or securing positions 11 providing 300 locations for positioning of magnetic shims 12. In practice, a total of some 1–49 shims 12 would typically be placed on a single drawer 8 to provide the magnetic shimming. A plurality of correction coils shown generally as 29 are positioned around axis 6.

The thickness, size and location of each shim and the required current in each shim coil must be determined to provide the required shimming. However, with some 300 or more possible locations and 10 or more correction coil currents it is obvious that a trial and error positioning of shims is not a practical approach.

The magnetic field present around imaging volume 4 after manufacture is measured or mapped in order to determine proper placement of magnetic shims 12. Measurement points are shown as dots 13 with imaging volume 4 being centered around the intersection 19 of Z axis 6 and centerline 15 of cylindrical vacuum vessel 2.

The plurality of spaced testing circles 17 formed by test points 13 is on a 45 cm diameter sphere extending for 22.5 cm along axis 6 on either side of intersection 19, providing a testing spherical surface 45 cm in the axial direction. Spherical surface 47 is shown enlarged for sake of clarity and explanation. In addition, 17 points are measured along Z axis 6 from −24 centimeters to +24 centimeters.

Utilizing a testing volume with 13 testing circles or vertical planes 17 each having 24 equally spaced test point 13 around the circumference plus 17 axial points thereof provides a total of 329 test points. The additional axial test points 21 inside the 45 cm sphere and test points 25 at the ends of testing volume 4 along axis 6, and beyond the volume, respectively, provide a total of 329 test points.

The magnetic field strength of the magnetic field indicated generally by arrow 22 is measured at each test point 13, 21 and 25. Correction coils such as 29 provide superconducting correction current flow to correct for inhomogeneities in magnetic field 22. Tesla Meter or probe 31, a nuclear magnetic resonance (NMR) Teslameter, manufactured by Metrolab Instruments SA of Geneva, Switzerland and sold as their model number 2025, is inserted into bore 5 along axis 6 as schematically indicated by arrow 33. Probe 31 is successively positioned along axis 6 such that the probe may be rotated as indicated by arrow 35 around circles 17 to read the magnetic field at each test point 13 of the circle, before being moved to the next circle or vertical plane, and the process repeated until all of the test point circles are measured and test points 21 and 25 are measured. The measured field information is then provided to computer 37 to enable mapping of the field as described below.

Alternatively, probe 31 can include multiple spaced sensors such as 39 (one of which is shown dotted as 41) such that a single positioning of the probe within imaging volume 4 and a single angular rotation 35 will provide multiple readings. With only 2 probes, such as shown in FIG. 1, each pair of testing circles at equal axial distances on either side of the largest diameter or central circle 29 may be mapped simultaneously reducing the positioning of the probes and test time almost in half.

A general procedure for calculating the appropriate shim thickness and locations and/or shim coil currents for a single magnet 10 thus involves measuring magnetic field 22 at test points 13, 21 and 25. The objective is to have field values at every measured point 13, 21 and 25 within one half tolerance of the mean overall field. The mean value of the overall field is one half the sum of the maximum and minimum field values anywhere in the measured field. This objective function is described in Equation 1:

$$\text{Minimize} \sum_{i=1}^{N} AX_i + T \quad \text{equation 1}$$

In which:
N is the total number of shim locations 11 plus the total number of correction coils
M is the total number of points 13, 21 and 25 at which the field is measured
Xi is the thickness of the shim at location I or current amplitude of coil I
A is a weighting factor
T is the peak to peak field tolerance beyond the allowable tolerance E
BMj is the measured field value at point j in the volume of interest; and Xi and T are unknown variables
$\Delta B_{ij}$ represents the change in the magnitude of the field at point j caused by a predetermined size shim at position i Equation 1 is subject to:

$$\sum_{i=1}^{N} \Delta B_{ij} + BMj - BMEAN \leq \frac{T}{2} + \frac{E}{2} \text{ for } j = 1 \text{ to } M \quad \text{equation 2}$$

$$\sum_{i=1}^{N} \Delta B_{ij} + BMj - BMEAN \leq \frac{T}{2} - \frac{E}{2} \text{ for } j = 1 \text{ to } M \quad \text{equation 3}$$

The above shimming relationship provides the shim thickness and/or correction coil currents $X_I$ at each location required to reduce the inhomogeneity to a value such as 10 ppm on 45 cm diameter spherical volume (DSV). It is suitable for shimming a magnet for a single larger volume such as 45 cm DSV. The procedure is nevertheless relatively costly and time consuming.

With the following procedure it is possible to shim multiple magnet designs on smaller volumes based on measurements of the larger volumes by reconstructing the magnetic field on smaller volumes using spherical harmonic coefficients from data taken at the surface of a single larger imaging volume.

As is well known, the Z component of the magnetic field, $B_z$, can be expressed at a point r as a sum of Legendre polynomials inside a sphere of radius R as shown below:

$$B_z = \sum_{l=0}^{\infty} \sum_{m=-l}^{m=l} C_{lm} P_{lm}\{\cos(\Theta)\}(r/R)^l \quad \text{equation 4}$$

A finite number of terms l, typically on the order of 20 or less are required to adequately describe the field inside the imaging volume. One solution is to shim the magnet to a state such that all $C_{lm}$ are zero other than the term l=m=0. This will leave the homogeneity on both the smaller and larger volumes perfectly uniform. This is not practicable in general, and more important, the higher order coefficients have proven harder to shim than the lower order coefficients. Thus, the practical solution minimizes the lower order coefficients to a level that satisfies the required homogeneity across the entire imaging volume while doing so with a practical shim hardware system. The following achieves adequate control over the low order harmonics terms in the expansion of the magnetic field.

The coefficients, $C_{lm}$, can be entered into the objective function of the shim relationship as follows:

$$\text{Minimize} \sum_{i=1}^{N} AX_i + \sum_{l=1}^{L} \sum_{m=-1}^{L} \{C_{lm} - G_{lm}\}^2 \quad \text{equation 5}$$

Where A and $X_I$ have the same meaning as in equation (1) above and consistent modifications are made to equations 2 and 3 above. The $G_{lm}$ terms are the goals or target values for each coefficient $C_{lm}$. As described above, the higher order terms are very difficult to control, thus target values are chosen such that the desired homogeneity can be achieved across the entire imaging volume at a minimum cost in shim hardware. In practice this means the higher order terms will be given values consistent with a given magnet design, as obvious to one skilled in the art.

The homogeneity across the entire volume can also be alternately controlled by controlling the homogeneity on the surface of the volume as shown by equation 4. The homogeneity can be controlled on the surface of volume 4 (see FIG. 1) by implementing an objective function such as:

$$\text{Minimize} \sum_{i=1}^{N} AX_i + \sum_{j=1}^{M} \{BM_j - BT_j\}^2 \qquad \text{equation 6}$$

Where A, X and $BM_j$ have the same meanings as in equation 1 and consistent modifications are made to equations 2 and 3 above, while $BT_j$ is the target value for the field at each of the M points on the surface of the imaging volume. This set of target values is chosen to produce the desired homogeneity across the imaging volume while minimizing the cost of the shim hardware. The set of target values for the field, $BT_j$ can be chosen in a manner similar to method 1 above by computing the field at the set of points where the field is measured by using a field expansion similar to equation 4 with the desired target coefficients $G_{lm}$.

The homogeneity across the entire volume can also alternatively be controlled by controlling the homogeneity on a set of points within the volume, as can be seen from equation 4. The homogeneity can be controlled on the set of points throughout the volume by an objective function similar to equation 6 such as:

$$\text{Minimize} \sum_{i=1}^{N} AX_i + \sum_{j=1}^{M} \{BM_j - BT_j\}^2 \qquad \text{equation 7}$$

With consistent modifications to equations 2 and 3, and where A, X and $BM_j$ have the same meanings as in equation 1, while $BT_j$ is the target value for the field at each of the M points chosen within the imaging volume. This set of target values is chosen to produce the desired homogeneity across the imaging volume while minimizing the cost of the shim hardware. The set of points can be chosen in a number of ways such as on a multiple set of spherical surfaces, such as 25 cm, 35 cm and 45 cm diameter spherical surfaces. The set of target values for the field, $BT_j$, can be chosen in a manner similar to method 1 above by computing the field at the set of points where the field is measured by using a field expansion similar to equation 4 with the desired target coefficients $G_{lm}$. In addition, weighting can be added to the above equations to emphasize certain harmonics or volumes.

One problem associated with implementing method 3 above, is measuring the field with sufficient accuracy on the 25 and 35 cm spherical surfaces with presently available test equipment which has measurement error on the order of 0.5 ppm, the same order of magnitude as the desired field homogeneity. Thus, a further component to the invention is provided to implement this method. The magnetic field can be obtained on the surfaces of the 25 cm to 35 cm spherical volumes by measuring the field on the 45 cm spherical surface, or some other similar surface where the inhomogeneity is large enough to be measured adequately using well known methods and existing measurement hardware. This measured field on the larger volume can be analyzed to produce the field expansion coefficients, $C_{lm}$, in equation 4 above. Once the $C_{lm}$ are determined from the data measured on the larger volume, the coefficients can be used to determine the field at the points on the smaller volumes such as 25 cm and 35 cm spherical surfaces within the volume. Thus, by this means, the field measurements, $BM_j$, can be determined at points inside the actual volume measured.

Referring next to FIG. 1 and FIG. 2 and by way of further explanation and summary, magnetic field 22 is measured 26 at test points 13, 21, 25 on operating superconducting magnet 10 having an imaging volume 4 in the order of 45 cm DSV. The magnetic field measured and mapped also utilizes the relationship above (equations 4–7) to reconstruct or calculate 28 using harmonic coefficients and computer 37. Also using computer 37, calculate 30 the shim 12 locations and thicknesses and correction coil 29 currents for several imaging volumes such as 45, 35 and 25 cm DSV with the smaller volumes having an increased homogeneity requirement. After implementing or installing 32 the calculated shims at shim locations and correction shim currents 30 at correction coil locations, the magnetic field 22 homogeneity is again measured 34 and checked or compared 36 with magnet homogeneity specifications or requirements. The process is reiterated 40 until the desired homogeneity is obtained for each superconducting magnet 10 for which the calculated shims are applied.

Reiteration 40 is not conducted, and/or the procedure is stopped 41 when magnetic field 22 meets or is less than 36 the parts per million specification for the particular magnet.

Measurement 34 after shimming 32 may be taken by repeating step 26 or alternatively by utilizing a homogeneous test sphere such as an LV or copper sulfate sphere inserted into imaging volume 4 which can be done more readily than the initial field measurements utilizing rotatable probe 31. A homogeneous test sphere moved axially through the imaging volume should provide a constant output signal to computer 37 in the presence of a homogeneous magnetic field 22 and differences indicate inhomogeneities. If the homogeneity is equal to or less than the specification (such as 0.5 ppm) either by calculation, or for larger volumes by measurement, the shimming is complete and is stopped 41. If not steps 26, 28, 30, 32, 34 and 36 may be reiterated until the required homogeneity is realized.

It is thus possible with the subject invention to map and determine correction coil 29 currents and the passive shim 12 sizes and locations with magnetic field measurements on the larger imaging volume 4 and calculating the passive shim sizes and locations for smaller and more homogeneous imaging volumes which cannot be accurately mapped and which are suitable for more demanding MRI applications such as cardiac imaging or high speed DWEPI, and for superconducting and permanent magnet resonance imaging magnets. This results in improved accuracy for the smaller imaging volumes and in addition decreases the time and in addition expense which would otherwise be incurred for individual magnet trial and error delineation.

While only certain features of the invention have been illustrated and described herein, many modifications and changes will occur to those skilled in the art. It is, therefore, to be understood that the appended claims are intended to cover all such modifications and changes as fall within the true spirit of the invention. As sued herein "in the order of" indicates a practical but not critical amount which may be varied to some degree.

What is claimed is:

1. A method of shimming a plurality of different magnetic resonance imaging magnet imaging volumes and different homogeneity requirements and including passive magnetic shims and correction coils comprising:

Measuring the magnetic field strength in the bore of one magnet at a predetermined number of points about an imaging volume around the axis of said magnet;

determining said magnetic field inhomogeneity from the measured magnetic field strength and the placement and thickness of said passive magnetic shims and said correction coil currents to correct for inhomogeneities in the measured imaging volume; and utilizing said magnetic field measurements and their harmonic coefficients to calculate the placement and thickness of passive magnetic shims and correction coil currents to provide at least one smaller imaging volume with less inhomogeneity of said magnetic field than for said measured imaging volume.

2. The method of claim 1 wherein said one magnetic resonance imaging magnet includes the largest of the imaging volumes of said plurality of related magnet imaging volumes.

3. The method of claim 1 wherein the measured imaging volume of said one magnet is the order of 45 centimeters diameter spherical volume with inhomogeneity in the order of 10 parts per million.

4. The method of claim 3 wherein the related imaging volumes of the magnetic resonance imaging magnet are in the order of 25–35 centimeters diameter spherical volume with the inhomogeneity in the order of 0.5–1.0 parts per million.

5. The method of claim 1 wherein the magnetic field strength of the imaging volume measured is measurable with greater accuracy than measurements of the magnetic field strength of said smaller imaging volume.

6. The method of claim 5 wherein the measurements and corrections are reiterated until the required homogeneity as indicated by the measured values being less than the required value for the mean overall magnetic field is obtained.

7. The method of claim 1 wherein said magnetic field strength is measured by rotating a magnetic field strength sensor about and along said axis of said magnetic resonance imaging magnet to measure a plurality of points which define a plurality of circles about said axis.

8. The method of claim 7 wherein there are in excess of 300 points.

9. The method of claim 6 wherein a plurality of spaced sensors are positioned along the axis of said magnetic resonance imaging magnet to map the magnetic field around a plurality of planes perpendicular to said axis by rotation of said sensors in a circle about said axis.

10. The method of claim 9 wherein a computer is provided to determine the location and thickness of said passive shims and correction coil currents.

11. A method of shimming a second imaging volume of a magnetic resonance imaging magnet including passive magnetic shims through magnetic mapping of a first larger imaging volume of a size practical to accurately measure magnetic field strength comprising:

measuring the magnetic field strength in the bore of said magnet at a predetermined number of points adjacent the said second smaller imaging volume;

mapping said magnetic field inhomogeneity from said measured field strength;

determining the placement and thickness of said passive magnetic shims to correct for said inhomogeneities in said second imaging volume utilizing harmonic coefficients from said mapping of said larger imaging volume;

installing said passive shims in the calculated positions; and checking the homogeneity of the passively shimmed magnet.

12. The method of claim 11 wherein said magnetic resonance imaging magnet includes correction coils and said calculation to minimize said inhomogeneities in said second imaging volume is in accordance with:

$$\text{Minimize} \sum_{i=1}^{N} AX_i + \sum_{l=1}^{L} \sum_{m=-1}^{L} \{C_{lm} - G_{lm}\}^2$$

wherein:
A is a weighting factor
Xi is the thickness of the shim at location I, and correction coil current of coil I
$G_{lm}$ are the goals on target values for each coefficient $C_{lm}$.

13. The method of claim 12 wherein a plurality of imaging volumes which are smaller and less inhomogeneous than the one actually mapped is determined in accordance with claim 12.

14. The method of claim 12 wherein said volume measured is a sphere and said harmonic coefficients are spherical harmonic coefficients.

15. The method of claim 14 wherein said magnets include an axis along which said imaging volumes are positioned and said mapping is accomplished by rotating a multi-element probe about said axis to position said multi-element probe about the outer boundaries of a spherical imaging volume which is larger than said second imaging volume.

16. The method of claim 11 wherein said magnet includes correction coils and said calculation to minimize said inhomogeneities is in accordance with:

$$\text{Minimize} \sum_{i=1}^{N} AX_i + \sum_{j=1}^{M} \{BM_j - BT_j\}^2$$

wherein:
A is a weighting factor
X is the thickness of the shim at location I, and current in correction coil I
BT is the target value for the field at each of M points on the surface of the imaging volume
BMj is the measured field value at each of the M points.

17. The method of claim 16 wherein a plurality of imaging volumes which are smaller and less inhomogenous than the one actually mapped is determined in accordance with claim 16.

18. The method of claim 17 wherein said imaging volume calculations include lower inhomogeneity target values BT which are impractical to directly map.

19. The method of claim 15 wherein said multi-element probe includes two sensors and said mapping is accomplished by rotating said multi-element probe to multiple positions about circles of the same size which are axially equidistant from the largest diameter circle of said sphere.

* * * * *